(12) United States Patent
Furutani et al.

(10) Patent No.: US 8,975,742 B2
(45) Date of Patent: Mar. 10, 2015

(54) PRINTED WIRING BOARD

(75) Inventors: Toshiki Furutani, Ogaki (JP); Takeshi Furusawa, Ogaki (JP)

(73) Assignee: IBIDEN Co., Ltd., Ogaki-shi (JP)

(*) Notice: Subject to any disclaimer, the term of this patent is extended or adjusted under 35 U.S.C. 154(b) by 138 days.

(21) Appl. No.: 13/598,751

(22) Filed: Aug. 30, 2012

(65) Prior Publication Data

US 2013/0221505 A1    Aug. 29, 2013

Related U.S. Application Data

(60) Provisional application No. 61/565,100, filed on Nov. 30, 2011.

(51) Int. Cl.
| | |
|---|---|
| *H01L 23/12* | (2006.01) |
| *H01L 23/053* | (2006.01) |
| *H01L 23/495* | (2006.01) |
| *H01L 23/498* | (2006.01) |

(52) U.S. Cl.
CPC .... *H01L 23/49541* (2013.01); *H01L 23/49822* (2013.01); *H01L 23/49838* (2013.01); *H01L 2224/16225* (2013.01); *H01L 2924/15311* (2013.01); *H01L 2924/3511* (2013.01); *H01L 23/49827* (2013.01)
USPC .............. 257/700; 257/758; 257/E23.036; 257/E23.062; 257/E23.07

(58) Field of Classification Search
USPC .......... 257/635, 700, 758, E23.036, E23.062, 257/E23.145, E23.173, 629, 775, 786, 257/E23.067, E23.07, E23.172, E23.175
See application file for complete search history.

(56) References Cited

U.S. PATENT DOCUMENTS

2008/0012140 A1* 1/2008 Tsukano et al. .............. 257/758
2009/0114429 A1* 5/2009 Sri-Jayantha et al. ........ 174/255

FOREIGN PATENT DOCUMENTS

JP    2007-088140    4/2007

* cited by examiner

*Primary Examiner* — Benjamin Sandvik
*Assistant Examiner* — Leslie Pilar Cruz
(74) *Attorney, Agent, or Firm* — Oblon, McClelland, Maier & Neustadt, L.L.P.

(57) ABSTRACT

A printed wiring board includes a substrate, a first buildup formed on a first surface of the substrate and including the outermost conductive layer, and a second buildup layer formed on a second surface of the substrate and including the outermost conductive layer. The outermost layer of the first buildup has pads positioned to connect a semiconductor component, the first buildup has a component mounting region directly under the component such that the outermost layer of the first buildup has a portion in the region, the outermost layer of the second buildup has a portion directly under the region, and the portions satisfy the ratio in the range of from 1.1 to 1.35, where the ratio is obtained by dividing a planar area of the portion of the second buildup by a planar area of the portion of the first buildup.

20 Claims, 7 Drawing Sheets

PRINTED WIRING BOARD

CROSS-REFERENCE TO RELATED APPLICATIONS

The present application is based on and claims the benefit of priority to U.S. Application No. 61/565,100, filed Nov. 30, 2011, the entire contents of which are incorporated herein by reference.

BACKGROUND OF THE INVENTION

1. Field of the Invention

The present invention relates to a printed wiring board where the area of the lowermost conductive layer is set greater than the area of the uppermost conductive layer when seen directly under an IC chip.

2. Discussion of the Background

Japanese Laid-Open Patent Publication No. 2007-88140 relates to an assembled printed board. In Japanese Laid-Open Patent Publication No. 2007-88140, a dummy circuit is formed on an upper or lower surface of an individual printed wiring board to equalize the ratios of remaining copper on the upper and lower conductive layers of the individual printed wiring board. The entire contents of this publication are incorporated herein by reference.

SUMMARY OF THE INVENTION

According to one aspect of the present invention, a printed wiring board includes a substrate having a first surface and a second surface on the opposite side of the first surface, a first buildup layer formed on the first surface of the substrate and including a resin insulation layer and multiple conductive layers including the outermost conductive layer, and a second buildup layer formed on the second surface of the substrate and including a resin insulation layer and multiple conductive layers including the outermost conductive layer. The outermost conductive layer of the first buildup layer has pads positioned to connect a semiconductor element, the first buildup layer has a component mounting region directly under the semiconductor element such that the outermost conductive layer of the first buildup layer has a conductive portion in the component mounting region, the outermost conductive layer of the second buildup layer has a conductive portion directly under the component mounting region, and the conductive portion in the outermost conductive layer of the first buildup layer and the conductive portion in the outermost conductive layer of the second buildup layer satisfy the ratio value in the range of from 1.1 to 1.35, where the ratio value is obtained by dividing a planar area of the conductive portion in the outermost conductive layer of the second buildup layer by a planar area of the conductive portion in the outermost conductive layer of the first buildup layer.

According to another aspect of the present invention, a printed wiring board includes a substrate having a first surface and a second surface on the opposite side of the first surface, a first conductive layer formed on the first surface of the substrate, a first resin insulation layer formed on the first surface of the substrate and the first conductive layer, a first outermost conductive layer formed on the first resin insulation layer, a second conductive layer formed on the second surface of the substrate, a second resin insulation layer formed on the second surface of the substrate and the second conductive layer, and a second outermost conductive layer formed on the second resin insulation layer. The first outermost conductive layer has a group of pads positioned to connect a semiconductor element, the first outermost conductive layer has a conductive portion in a component mounting region directly under the semiconductor element, the second outermost conductive layer has a conductive portion directly under the component mounting region, and the conductive portion in the first outermost conductive layer and the conductive portion in the second outermost conductive layer satisfy the ratio value in a range of from 1.1 to 1.35, where the ratio value is obtained by dividing a planar area of the conductive portion in the second outermost conductive layer by a planar area of the conductive portion in the first outermost conductive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
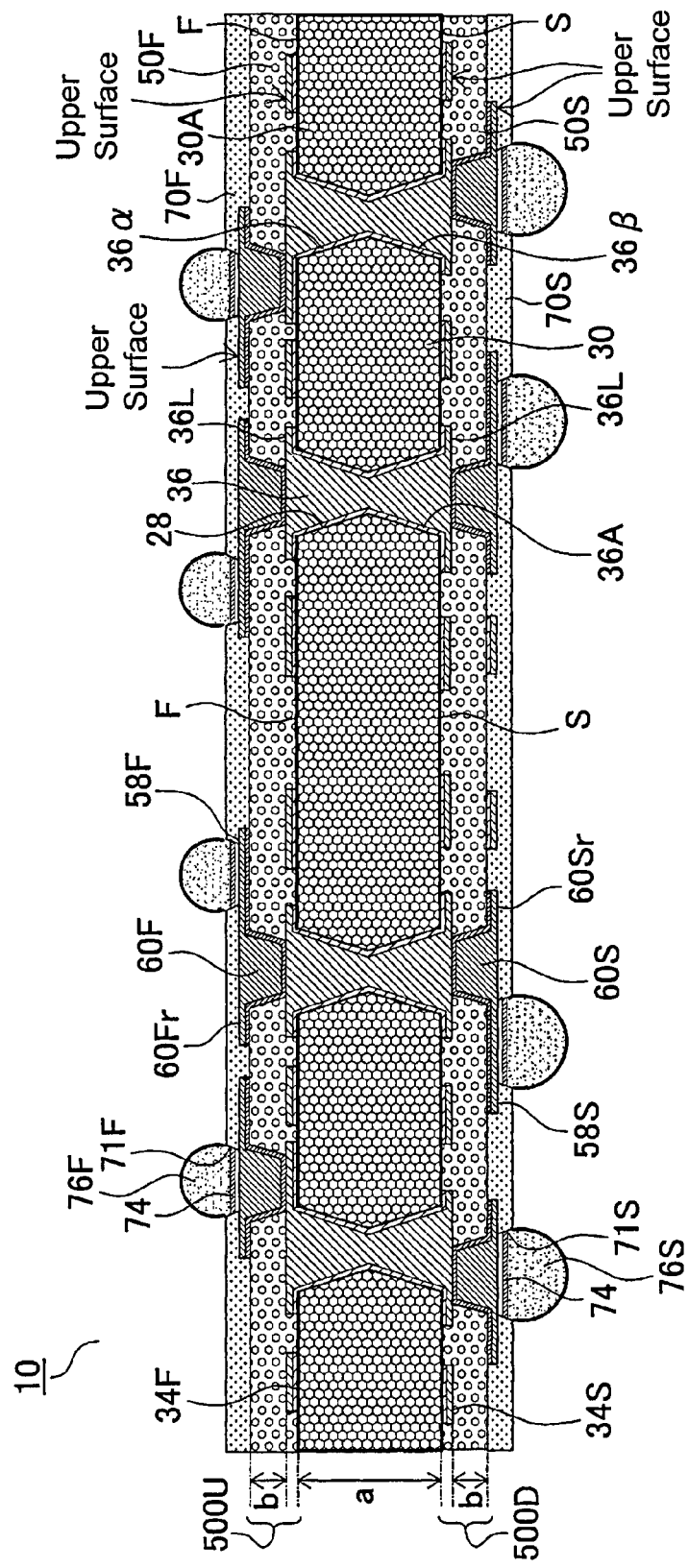
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

Figure 2:
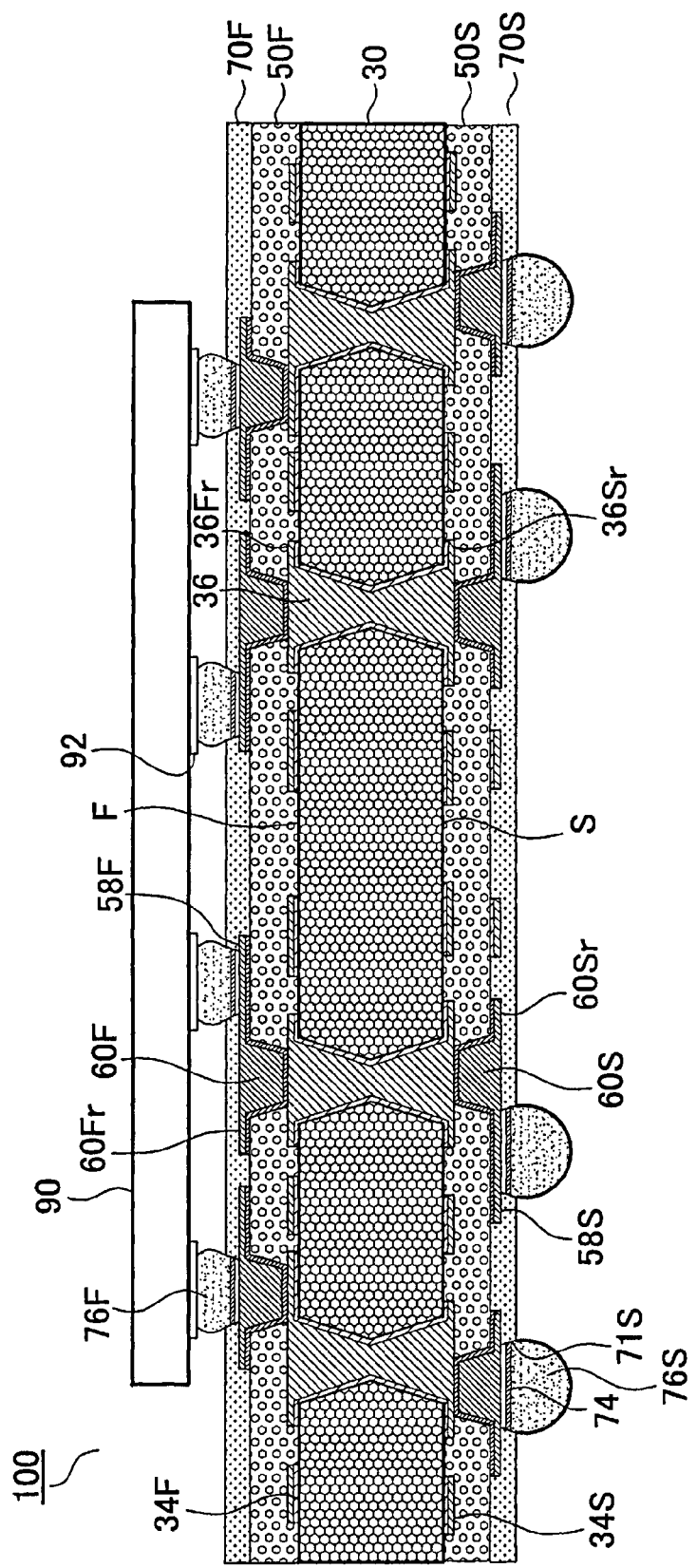
FIG. 2 is an applied example of a printed wiring board of the first embodiment.
Figure 3:
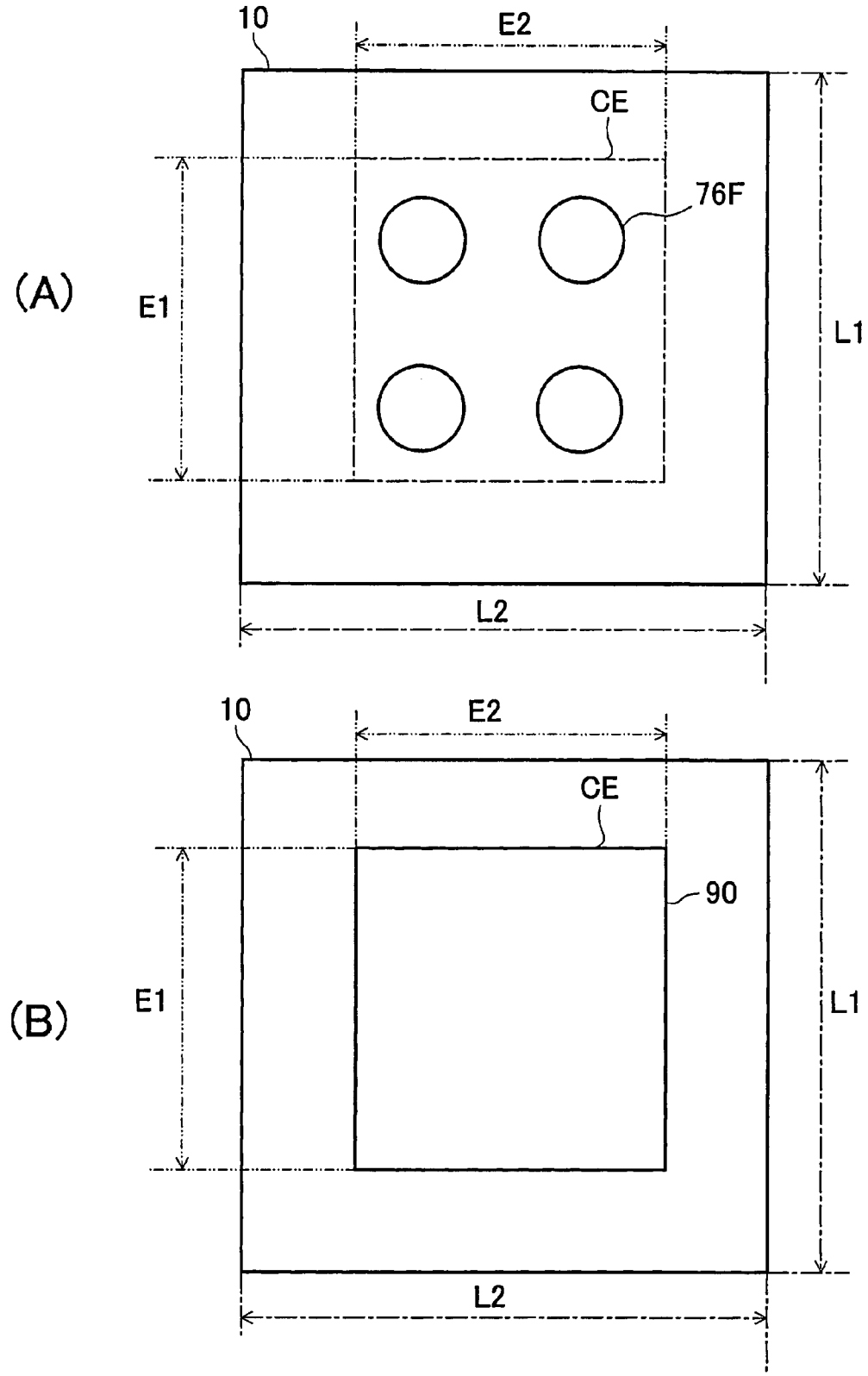
FIG. 3A is a plan view of the printed wiring board shown in FIG. 1.
FIG. 3B is a plan view of the printed wiring board shown in FIG. 2.

FIGS. 1~3 show the structure of printed wiring board 10 according to a first embodiment of the present invention. FIG. 1 is a cross-sectional view of printed wiring board 10. Printed wiring board 10 is formed with core substrate 30, upper buildup layer (500U) and lower buildup layer (500D). Core substrate 30 has insulative base (30A) with first surface (F) and second surface (S) opposite the first surface, first conductive layer (34F) formed on the first surface of the insulative base, and second conductive layer (34S) formed on the second surface. Moreover, the core substrate has through-hole conductor 36 formed in penetrating hole (36A) of the insulative base, and through-hole conductor 36 connects the first conductive layer and the second conductive layer. Penetrating hole (36A) is made up of first opening portion (36α) gradually narrowing from the first surface of insulative base (30A) toward the second surface and of second opening portion (36β) gradually narrowing from the second surface of insulative base (30A) toward the first surface. The through-hole conductor is preferred to be made of plated film that fills the penetrating hole. The first and second conductive layers include multiple conductive circuits and lands (36L) of through-hole conductors.

Figure 5:
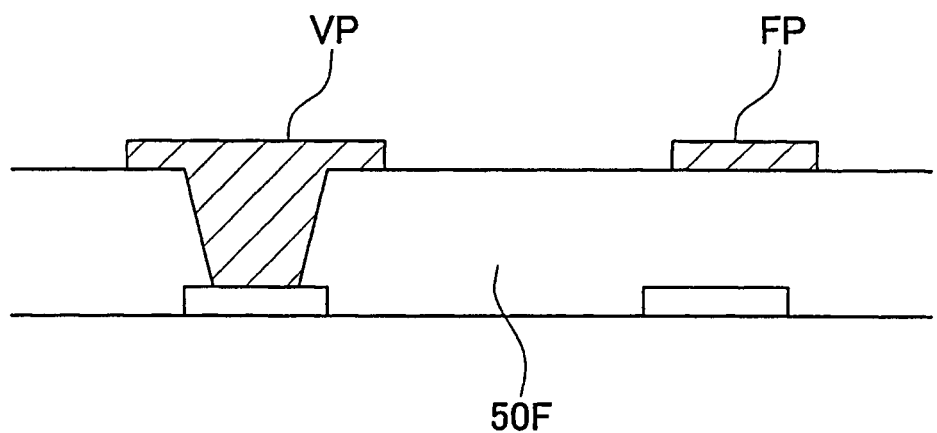
FIG. 5 is a cross sectional view of an upper pad.
Figure 6:
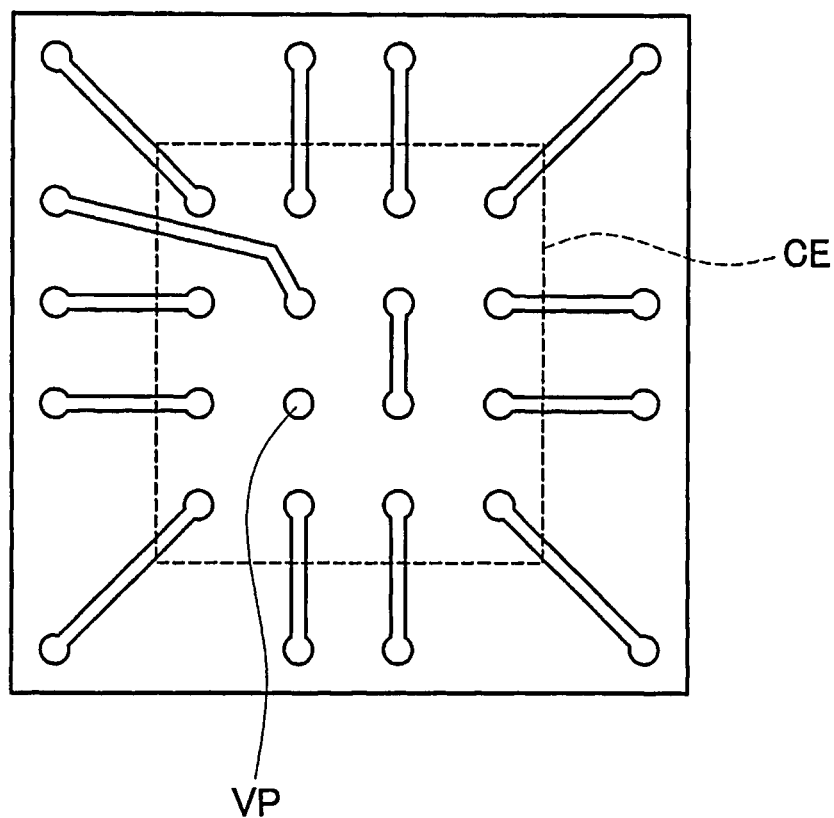
FIG. 6 is a plan view of the uppermost conductive layer.

Printed wiring board 10 has an upper buildup layer on the first surface of the core substrate and a lower buildup layer on the second surface of the core substrate. The first surface of the core substrate corresponds to the first surface of the insulative base, and the second surface of the core substrate corresponds to the second surface of the insulative base. The upper buildup layer is formed with upper resin insulation layer (50F), uppermost conductive layer (58F) on the upper resin insulation layer, and via conductor (60F) which is formed in the upper resin insulation layer and connects the uppermost conductive layer and the first conductive layer. The uppermost conductive layer includes multiple conductive circuits, multiple via lands (60Fr) and multiple upper pads for mounting a semiconductor element. The upper pads are formed in component mounting region (CE) directly under the semiconductor element. Upper pads include flat pad (FP) formed on the uppermost resin insulation layer and via pad (VP) made of via conductor (60F) and via land (60Fr) surrounding the via conductor (FIG. 5). In addition to upper pads, conductive circuits connecting the upper pads and conductive circuits extending from the upper pads to the outside of the component mounting region are formed in the component mounting region. The uppermost conductive layer formed in the component mounting region is the conductive layer in the component mounting region (FIG. 6). FIG. 6 is a plan view of the uppermost conductive layer. The region inside the broken line is the component mounting region.

The lower buildup layer is formed with lower resin insulation layer (50S), lowermost conductive layer (58S) on the lower resin insulation layer, and via conductor (60S) which is formed in the lower resin insulation layer and connects the lowermost conductive layer and the second conductive layer. The lowermost conductive layer includes multiple conductive circuits, multiple via lands (60Sr), and lower pads for connection with a motherboard. The lowermost conductive layer formed directly under the component mounting region is the conductive layer directly under the component mounting region. A via land is formed around a via conductor and is directly connected to the via conductor.

Printed wiring board 10 further includes solder-resist layers (70F, 70S) formed on the upper and lower buildup layers. The solder-resist layers have openings (71F, 71S) to expose pads, and metal film 74 made of Sn or the like is formed on the pads exposed through such openings. Solder bump (76F) is formed on an upper pad for mounting a semiconductor element, and solder bump (76S) is formed on a lower pad for connection with a motherboard.

FIG. 2 shows applied example 100 (semiconductor unit) of printed wiring board 10 shown in FIG. 1. IC chip 90 is mounted on the printed wiring board. Solder bump (76F) of printed wiring board 10 is connected to terminal 92 of IC chip 90.

FIG. 3(A) is a plan view of printed wiring board 10 shown in FIG. 1, and FIG. 3(B) is a plan view of semiconductor unit 100 shown in FIG. 2. The lengths of sides (L1, L2) of printed wiring board 10 are each 14 mm~18 mm, and sides (E1, E2) of component mounting region (CE), namely, the size of IC chip 90 shown in FIG. 3(B), are each 9 mm~12 mm.

The insulative base of the first embodiment is formed with reinforcing material such as glass cloth, resin such as epoxy, and inorganic particles made of silica or alumina. The amount of inorganic particles is 20 wt. %~40 wt. %. Thickness (a) of insulative base (30A) is 0.1 mm~0.3 mm. To provide a thin printed wiring board with less warping, thickness (a) of the insulative base is preferred to be 0.1 mm~0.2 mm. Resin insulation layers (50F, 50S) of the upper and lower buildup layers are formed with resin such as epoxy and inorganic particles made of silica or alumina. The resin insulation layers of the buildup layers are preferred not to contain reinforcing material such as glass cloth to form fine via conductors. In addition, it is easier to suppress warping of the printed wiring board during a reflow process. Thickness (b) of the upper and lower resin insulation layers is 20 μm~35 μm. Thickness (b) is preferred to be set the same in the upper and lower resin insulation layers. It is easier to suppress warping of the printed wiring board during a reflow process. For the same reason, the materials for the upper and lower resin insulation layers are preferred to be the same.

Figure 7:
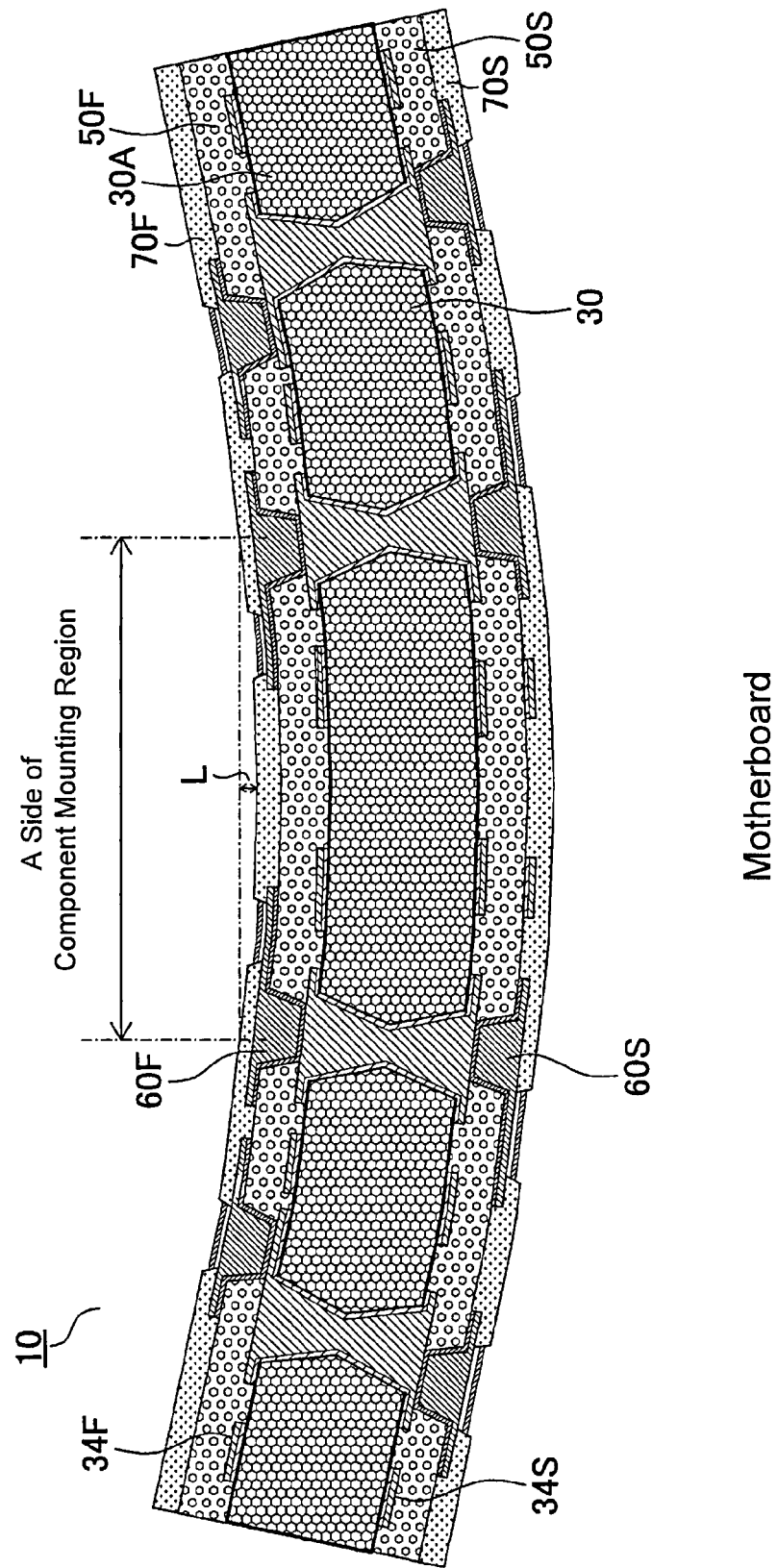
FIG. 7 is a cross-sectional view of a printed wiring board according to an embodiment during a reflow process.

The area of the upper surface (area (U)) of the uppermost conductive layer in the component mounting region is smaller than the area of the upper surface (area (B)) of the lowermost conductive layer directly under the component mounting region. Here, the area of the upper surface of the conductive layer in the component mounting region is obtained by adding the upper surface areas of the uppermost conductive layer existing in the component mounting region. Also, the area of the upper surface of the conductive layer directly under the component mounting region is obtained by adding the upper surface areas of the lowermost conductive layer existing directly under the component mounting region. When area (B) is divided by area (U), ratio (X) is 1.1 to 1.35. If ratio (X) is in that range, the printed wiring board warps during a reflow process in such a way that the component mounting region is recessed (FIG. 7). The amount of warping (L) is 20 μm to 70 μm (FIG. 7). The amount of warping at 220 degrees is preferred to be in that range. Especially when the thickness of a semiconductor element (IC chip) is 50 μm to 150 μm, the direction of warping and the amount of warping of the semiconductor element at the reflow temperature tends to be the same as in the printed wiring board of the first embodiment. Thus, using the printed wiring boards of the first embodiment, mounting yields of IC chips increase even when the IC chips are thin. Also, connection reliability is enhanced between IC chips and the printed wiring boards.

Among the multiple resin layers and multiple conductive layers of a printed wiring board, the resin layers and conductive layers formed in the outer portions are thought to have an effect on the warping of the printed wiring board. In addition, since conductive layers are metallic, their rigidity is higher than solder-resist layers formed in the outermost portions of the printed wiring board. Therefore, warping of a printed wiring board is thought to be controlled by making a difference between the uppermost conductive layer and the lowermost conductive layer. Accordingly, the area of the conductive layer positioned closest to the semiconductor element (uppermost conductive layer) is set different from the area of the conductive layer positioned farthest from the semiconductor element (lowermost conductive layer) in the first embodiment. Since the warping in the component mounting region affects mounting, ratio (X) is set to be 1.1 to 1.35 in the first embodiment. Therefore, the printed wiring board warps in such way that the central portion of the component mounting region becomes recessed during component mounting. Furthermore, if ratio (X) is set to be 1.2 to 1.35, the component mounting region and the semiconductor element tend to deform in the same manner at the mounting temperature.

Second Embodiment

Figure 4:
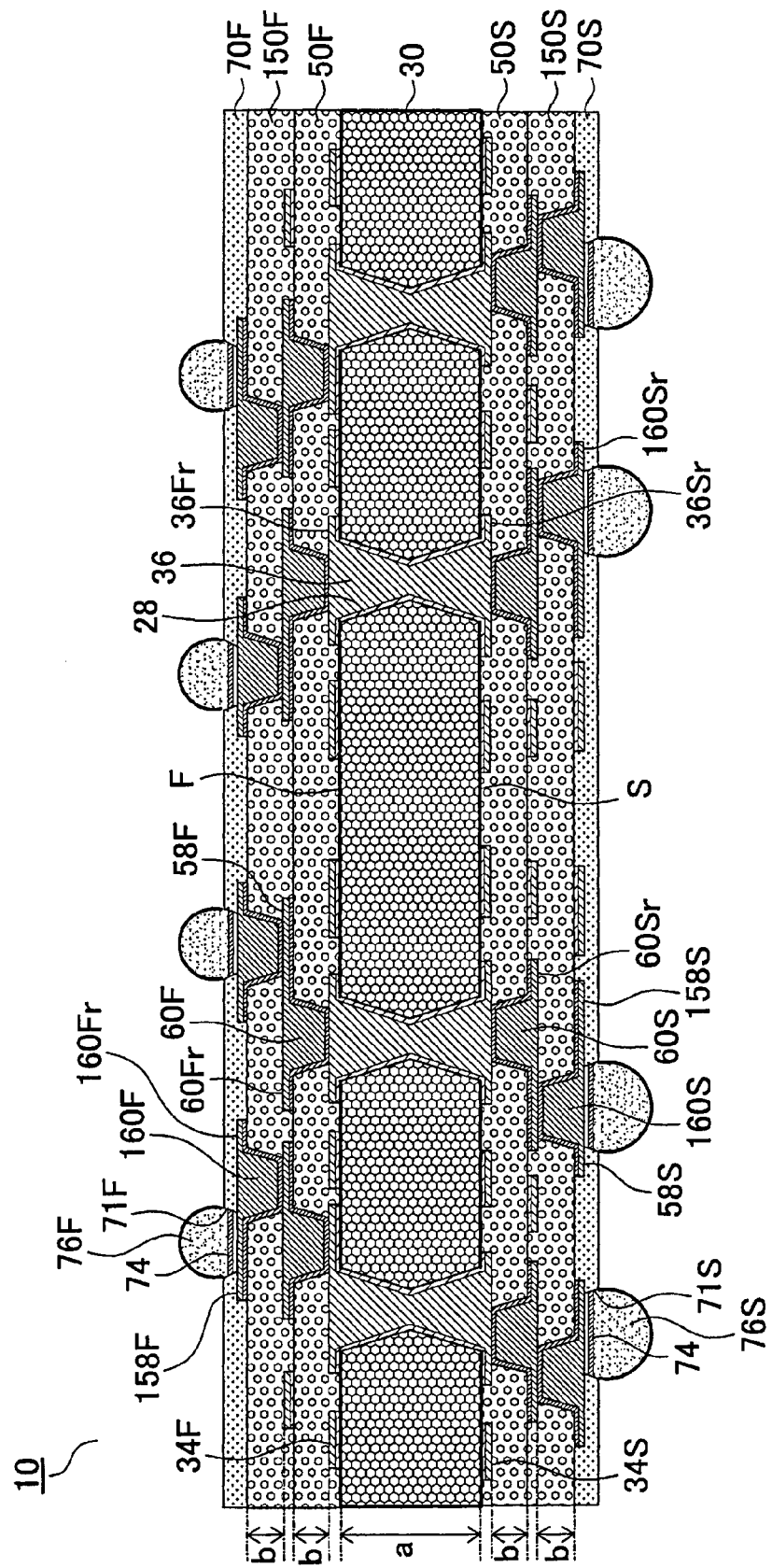
FIG. 4 is a cross-sectional view of a printed wiring board according to a second embodiment of the present invention.

FIG. 4 shows a cross-sectional view of a printed wiring board according to a second embodiment. The upper and lower buildup layers of the printed wiring board of the first embodiment are single layered, but the upper and lower buildup layers of the second embodiment are double layered.

Namely, the printed wiring board of the second embodiment includes two resin insulation layers and two conductive layers. In the second embodiment, the uppermost conductive layer is referred to as (158F) and the lowermost conductive layer is referred to as (158S). In the printed wiring board of the second embodiment, ratio (X) is set to be 1.1 to 1.35, the same as in the printed wiring board of the first embodiment.

Printed wiring boards of the first and second embodiments may include one or more of the contents described as follows. Solder-resist layers and upper and lower resin insulation layers are preferred not to contain reinforcing material. However, solder-resist layers and upper and lower resin insulation layers may contain inorganic particles such as silica. Since resin has lower rigidity than conductive layers, it is thought that resin does not have much effect on the warping of a printed wiring board. The materials and thicknesses of solder-resist layers (70F, 70S) formed on the upper and lower buildup layers and upper and lower resin insulation layers are preferred to be approximately the same. If their materials and thicknesses are significantly different, solder-resist layers and resin insulation layers do not have much effect on warping. The acceptable difference in their thicknesses is ±7.5%.

In the same manner, the materials and thicknesses of uppermost and lowermost conductive layers are preferred to be approximately the same. The acceptable difference in their thicknesses is ±7.5%.

The areas and thicknesses of the conductive layers of the core (first and second conductive layers) positioned directly under the component mounting region are also preferred to be approximately the same. (The area of the second conductive layer directly under the component mounting region)/(the area of the first conductive layer directly under the component mounting region) is preferred to be 0.9 to 1.3. In addition, (the thickness of the first conductive layer)/(the thickness of the second conductive layer) is preferred to be 0.95 to 1.05. If it is in such a range, the conductive layers of the core substrate do not have much effect on the warping of the printed wiring board. Furthermore, (the area of the second conductive layer directly under the component mounting region)/(the area of the first conductive layer directly under the component mounting region) is preferred to be 1.05 or greater. The printed wiring board and the semiconductor element tend to warp in the same manner during the reflow process.

The thickness of the insulative base is preferred to be 70 μm to 250 μm. If the thickness is in such a range, it is easier to control warping of the printed wiring board using ratio (X). The thickness of the insulative base is preferred to be 100 μm to 200 μm. If the thickness is in such a range, the printed wiring board and the semiconductor element tend to warp in the same manner during the reflow process.

The size of the component mounting region is preferred to be 9 mm☐ to 12 mm☐ (81 mm2 to 144 mm2). When an IC chip smaller than such a range is mounted on a printed wiring board, warping of the printed wiring board does not cause much trouble. If an IC chip larger than such a range is mounted on a printed wiring board, it is difficult to control the warping of the component mounting region using ratio (X).

When ratio (X) is in the range of 1.1 to 1.35, the amount of warping (L) in the component mounting region at the reflow process is controlled from 20 μm to 70 μm. If the amount of warping during the reflow process is in such a range, an IC chip is securely mounted on the printed wiring board. Also, connection failure between the IC chip and the printed wiring board caused by thermal stress while in use does not occur. The temperature during the reflow process is 220 degrees, for example.

Ratio (U) occupied by the uppermost conductive layer in the component mounting region (area (U)/the area of the component mounting region) is preferred to be 50% to 75%. If occupied ratio (U) is smaller than 50%, the rigidity of the component mounting region decreases, causing an increase in undulation. Also, if occupied ratio (U) is greater than 75%, the amount of warping in the component mounting region during the reflow process is small. Mounting yields are thought to be reduced. Ratio (CU) occupied by the first conductive layer directly under the component mounting region is preferred to be 60% to 80%. Here, occupied ratio (CU) is (the area of the first conductive layer directly under the component mounting region)/(the area of the component mounting region). The area of the first conductive layer directly under the component mounting region means the area of the upper surface of the first conductive layer existing directly under the component mounting region. When multiple conductors (such as conductive circuits and lands) exist directly under the component mounting region, the area of the upper surface is the value obtained by adding the upper surface of each conductor. If occupied ratio (CU) is outside the above range, it is thought that the core substrate has a significant effect on warping.

Ratio (CD) occupied by the second conductive layer directly under the component mounting region is preferred to be 60% to 85%. Here, occupied ratio (CD) is (the area of the second conductive layer directly under the component mounting region)/(the area of the component mounting region). The area of the second conductive layer directly under the component mounting region means the area of the upper surface of the second conductive layer existing directly under the component mounting region. When multiple conductors (such as conductive circuits and lands) exist directly under the component mounting region, the area of the upper surface is the value obtained by adding the upper surface of each conductor. If occupied ratio (CD) is outside the above range, it is thought that the core substrate has a significant effect on warping.

Ratio (B) occupied by the lowermost conductive layer directly under the component mounting region (area (B)/the area of the component mounting region) is preferred to be 55% to 80%. If occupied ratio (B) is smaller than 55%, the amount of warping in the component mounting region during the reflow process decreases. Also, if occupied ratio (B) is greater than 80%, the amount of warping in the component mounting region during the reflow process increases. The upper surface of each conductive layer is the surface on the solder-resist layer side. Upper surfaces are indicated in FIG. 1.

Example 1

Double-sided copper-clad laminate (4785GS series made by Sumitomo Bakelite Co., Ltd.) is prepared as a starting material. The thickness of insulative base (30A) is 150 μm. Next, first and second conductive layers are formed on the insulative base. The thickness of the first conductive layer is 25 μm, and the thickness of the second conductive layer is 25 μm. Also, through-hole conductors that penetrate through the insulative base are formed to connect the first and second conductive layers. Core substrate 30 is completed to have the insulative base, the first conductive layer, the second conductive layer and through-hole conductors. Core substrate 30 is manufactured by a method described in WO2007/097440A1, for example. The size of a component mounting region formed later is 10 mm☐ (100 mm2). Occupied ratio (CU) is 65%, and (CD) is 70%.

An upper buildup layer is formed on a first surface of the core substrate, and a lower buildup layer is formed on a second surface of the core substrate. Upper pads for mounting an IC chip are formed in the above component mounting region (10 mm□). The upper and lower buildup layers are each single layered. The buildup layers are manufactured by a method described in WO2007/097440A1, for example. The thickness of the uppermost conductive layer is 15 µm, and the thickness of the lowermost conductive layer is 15 µm. In addition, the thickness of the upper resin insulation layer is 25 µm, and the lower resin insulation is 25 µm. Area (U) is 60.2 mm2, and area (B) is 73.7 mm2. Ratio (X) is 1.22.

Next, solder-resist layers having openings to expose upper and lower pads are formed on the upper and lower buildup layers. Then, metal film made of Sn is formed on the pads. Solder-resist layers and metal film are manufactured by a method described in WO2007/097440A1, for example. Since ratio (X) is set at 1.22 in example (1), the component mounting region warps as shown in FIG. 7 at 220 degrees, and the amount of warping (L) in the component mounting region is 20 µm to 70 µm.

Example 2

A printed wiring board is manufactured the same as in example (1). However, area (U) is 54.6 mm2, and area (B) is 73.7 mm2. Ratio (X) is 1.35. The component mounting region warps as shown in FIG. 7 at 220 degrees, and the amount of warping (L) in the component mounting region is 20 µm to 70 µm.

Example 3

A printed wiring board is manufactured the same as in example (1). However, area (U) is 67 mm2, and area (B) is 73.7 mm2. Ratio (X) is 1.1. The component mounting region warps as shown in FIG. 7 at 220 degrees.

Comparative Example 1

A printed wiring board is manufactured the same as in example (1). However, area (U) is 70.5 mm2, and area (B) is 73.7 mm2. Ratio (X) is 1.05. The amount of warping (L) at 220 degrees has a plus value in one wiring board and a minus value in another wiring board. The direction of warping is opposite in the plus and minus values. In the printed wiring board in FIG. 7, (L) is in a plus direction.

Comparative Example 2

A printed wiring board is manufactured the same as in example (1). However, area (U) is 52.6 mm2, and area (B) is 73.7 mm2. Ratio (X) is 1.4. The amount of warping at 220 degrees exceeds 70 µm.

In the above second embodiment, the upper and lower buildup layers are double layered. However, they may be triple layered or greater.

A semiconductor element may be mounted on solder bumps of a printed wiring board through a reflow process. During that time, it is thought that the semiconductor element may warp if it is thin. During the reflow process, if the printed wiring board is flat, it is thought that connection failure may occur between the semiconductor element and the printed wiring board. Also, it is thought that connection breakage may occur between the semiconductor element and the printed wiring board while they are in use.

A printed wiring board according to an embodiment of the present invention has the following: an insulative base having a first surface and a second surface opposite the first surface; a first conductive layer formed on the first surface of the insulative base; a second conductive layer formed on the second surface of the insulative base; an upper resin insulation layer formed on the first surface of the insulative base and on the first conductive layer; an outermost conductive layer formed on the upper resin insulation layer and having multiple upper pads for connection with a semiconductor element; a lower resin insulation layer formed on the second surface of the insulative base and on the second conductive layer; and a lowermost conductive layer formed on the lower resin insulation layer. In such a printed wiring board, the uppermost conductive layer is made up of a conductive layer existing in a component mounting region directly under the semiconductor element and of the rest of the conductive layer, and when the planar area of the lowermost conductive layer existing directly under the component mounting region is divided by the planar area of the uppermost conductive layer existing in the component mounting region, obtained value (X) is in the range of 1.1 to 1.35.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a substrate having a first surface and a second surface on an opposite side of the first surface;
   a first buildup layer formed on the first surface of the substrate and comprising a resin insulation layer and a plurality of conductive layers including an outermost conductive layer; and
   a second buildup layer formed on the second surface of the substrate and comprising a resin insulation layer and a plurality of conductive layers including an outermost conductive layer,
   wherein the outermost conductive layer of the first buildup layer has a plurality of pads positioned to connect a semiconductor element, the first buildup layer has a component mounting region directly under the semiconductor element such that the outermost conductive layer of the first buildup layer has a conductive portion in the component mounting region, and the outermost conductive layer of the second buildup layer has a conductive portion directly under the component mounting region such that the conductive portion in the component mounting region in the first buildup layer and the conductive portion directly under the component mounting region in the second buildup layer satisfy a ratio value in a range of from 1.1 to 1.35, where the ratio value is obtained by dividing a planar area of the conductive portion in the outermost conductive layer of the second buildup layer by a planar area of the conductive portion in the outermost conductive layer of the first buildup layer.

2. The printed wiring board according to claim 1, wherein the ratio value is 1.2 or greater.

3. The printed wiring board according to claim 2, wherein the planar areas are areas of outer surfaces of the conductive portions in the outermost conductive layers in the first and second buildup layers.

4. The printed wiring board according to claim 2, wherein the plurality of conductive layers in the first buildup layer includes a first conductive layer formed on the first surface of the substrate and having a conductive portion directly under the component mounting region, the plurality of conductive layers in the second buildup layer includes a second conductive layer formed on the second surface of the substrate and having a conductive portion directly under the component mounting region, and the conductive portions of the first and second conductive layers satisfy a ratio value in a range of from 0.9 to 1.3, where the ratio value is obtained by dividing a planar area of the conductive portion of the second conductive layer by a planar area of the conductive portion of the first conductive layer.

5. The printed wiring board according to claim 2, wherein the component mounting region has a size which is in a range of from 9 mm×9 mm to 12×12 mm.

6. The printed wiring board according to claim 2, wherein the substrate includes a reinforcing material, and each of the resin insulation layers in the first and second buildup layers does not contain a reinforcing material.

7. The printed wiring board according to claim 2, wherein the first buildup layer is warped at 220 degrees such that the component mounting region forms a recess.

8. The printed wiring board according to claim 1, wherein the planar areas are areas of outer surfaces of the conductive portions in the outermost conductive layers in the first and second buildup layers.

9. The printed wiring board according to claim 1, wherein the plurality of conductive layers in the first buildup layer includes a first conductive layer formed on the first surface of the substrate and having a conductive portion directly under the component mounting region, the plurality of conductive layers in the second buildup layer includes a second conductive layer formed on the second surface of the substrate and having a conductive portion directly under the component mounting region, and the conductive portions of the first and second conductive layers satisfy a ratio value in a range of from 0.9 to 1.3, where the ratio value is obtained by dividing a planar area of the conductive portion of the second conductive layer by a planar area of the conductive portion of the first conductive layer.

10. The printed wiring board according to claim 1, wherein the component mounting region has a size which is in a range of from 9 mm×9 mm to 12×12 mm.

11. The printed wiring board according to claim 1, wherein the substrate includes a reinforcing material, and each of the resin insulation layers in the first and second buildup layers does not contain a reinforcing material.

12. The printed wiring board according to claim 1, wherein the first buildup layer is warped at 220 degrees such that the component mounting region forms a recess.

13. The printed wiring board according to claim 1, wherein the substrate has a through-hole conductor formed in a penetrating hole through the substrate such that the first conductive portion in the first buildup layer is electrically connected to the second conductive portion in the second buildup layer through the through-hole conductor, and the penetrating hole has a first opening portion narrowing from the first surface toward the second surface of the substrate and a second opening portion narrowing from the second surface toward the first surface of the substrate.

14. A printed wiring board, comprising:
a substrate having a first surface and a second surface on an opposite side of the first surface;
a first conductive layer formed on the first surface of the substrate;
a first resin insulation layer formed on the first surface of the substrate and the first conductive layer;
a first outermost conductive layer formed on the first resin insulation layer;
a second conductive layer formed on the second surface of the substrate;
a second resin insulation layer formed on the second surface of the substrate and the second conductive layer; and
a second outermost conductive layer formed on the second resin insulation layer,
wherein the first outermost conductive layer has a plurality of pads positioned to connect a semiconductor element, the first outermost conductive layer has a conductive portion in a component mounting region directly under the semiconductor element, and the second outermost conductive layer has a conductive portion directly under the component mounting region such that the conductive portion in the component mounting region in the first outermost conductive layer and the conductive portion directly under the component mounting region in the second outermost conductive layer satisfy a ratio value in a range of from 1.1 to 1.35, where the ratio value is obtained by dividing a planar area of the conductive portion in the second outermost conductive layer by a planar area of the conductive portion in the first outermost conductive layer.

15. The printed wiring board according to claim 14, wherein the ratio value is 1.2 or greater.

16. The printed wiring board according to claim 14, wherein the planar areas are areas of outer surfaces of the conductive portions in the first and second outermost conductive layers.

17. The printed wiring board according to claim 14, wherein the conductive portions of the first and second outermost conductive layers satisfy a ratio value in a range of from 0.9 to 1.3, where the ratio value is obtained by dividing a planar area of the conductive portion of the second outermost conductive layer by a planar area of the conductive portion of the first outermost conductive layer.

18. The printed wiring board according to claim 14, wherein the component mounting region has a size which is in a range of from 9 mm×9 mm to 12×12 mm.

19. The printed wiring board according to claim 14, wherein the substrate includes a reinforcing material, and each of the first and second resin insulation layers does not contain a reinforcing material.

20. The printed wiring board according to claim 14, wherein the first outermost conductive layer is warped at 220 degrees such that the component mounting region forms a recess.

* * * * *